United States Patent [19]
Sunami et al.

[11] 4,041,521
[45] Aug. 9, 1977

[54] SHIFT ARRAY FOR PATTERN INFORMATION PROCESSING DEVICE UTILIZING CHARGE COUPLED SEMICONDUCTOR DEVICE

[75] Inventors: Hideo Sunami, Kokubunji; Yokichi Itoh, Hachioji; Fumiyuki Inose; Yoshiaki Kamigaki, both of Kokubunji, all of Japan

[73] Assignee: Hitachi, Ltd., Japan

[21] Appl. No.: 298,569

[22] Filed: Oct. 18, 1972

[30] Foreign Application Priority Data

Oct. 18, 1971 Japan .................................. 46-81691

[51] Int. Cl.² ........................................... H01L 29/78
[52] U.S. Cl. ......................................... 357/24; 357/68
[58] Field of Search ................ 317/235 G; 307/221 C

[56] References Cited
U.S. PATENT DOCUMENTS

| 3,473,032 | 10/1969 | Lehovec | 317/239 |
| 3,643,106 | 2/1972 | Berwin et al. | 307/221 C |
| 3,656,011 | 4/1972 | Weinberg | 317/235 CR |

OTHER PUBLICATIONS

Electronics, "The New Concept for Memory and Imaging: Charge Coupling" by Altman, June 1971, pp. 50-59.

Primary Examiner—Edward J. Wojciechowicz
Attorney, Agent, or Firm—Craig & Antonelli

[57] ABSTRACT

A shift array for shifting carriers introduced into a semiconductor body toward the X-direction and Y-direction comprises an insulating layer disposed on the semiconductor body, first electrodes disposed on the insulating layer and arranged in a matrix on the X-Y plane, second electrodes disposed between adjacent first electrodes, conductors disposed adjacent to the first electrodes to be connected to the electrodes of each row when carriers are transferred toward the Y-direction, conductors disposed adjacent to the first electrodes to be connected to the electrodes of each column when carriers are transferred toward the X-direction. When carriers are transferred toward the X-direction, the second electrodes disposed between the adjacent first electrodes of each column are biased with a DC voltage whose electrical polarity is reversed relative to the DC voltage applied to the first electrodes for preventing the transit of carriers toward the Y-direction. When carriers are transferred toward the Y-direction, the second electrodes disposed between the adjacent first electrodes of each row are biased with a DC voltage whose polarity is reversed relative to the DC voltage applied to the first electrodes for preventing the transit of carriers toward the X-direction.

8 Claims, 5 Drawing Figures

SHIFT ARRAY FOR PATTERN INFORMATION PROCESSING DEVICE UTILIZING CHARGE COUPLED SEMICONDUCTOR DEVICE

This invention relates to an X-Y dual directional shift array utilizing charge coupled semiconductor elements, and more particularly, to an X-Y dual directional shift array wherein charge coupled semiconductor elements are arranged two-dimensionally, whereby minority carriers, as a pattern information signal, can be transferred toward the X-direction and the Y-direction inclined at an angle of $\theta$ from the X-direction.

In a conventional information processing device, it is occasionally required that the axes of co-ordinates of a pattern distributed two-dimensionally be rotated. In that case, the rotation is accomplished by utilizing electrical computers, but there is a drawback such that it takes a lot of time and the efficiency becomes low.

It is, therefore, an object of the present invention to provide a shift array composed of a pattern information processing device, which is able to easily rotate the axes of the co-ordinates of a pattern distributed two-dimensionally at an angle of $\theta$.

To accomplish the above object, in the present invention, many charge coupled semiconductor elements are disposed on one semiconductor body and electrodes of the charge coupled semiconductor elements are arranged in a matrix, so as to form a row of electrodes toward the X-direction and a column of electrodes toward the Y-direction.

The present invention can be utilized not only in a digital computer as a shift register for a digital signal of a two-dimensional pattern but in an image device and a scanning device as a shift register for an analog signal of a two-dimensional pattern.

Additional objects and advantages of the present invention will become apparent from the following description beginning with a brief explanation of a conventional charge coupled semiconductor device, when taken in conjunction with the accompanying drawings, wherein.

Figure 1:
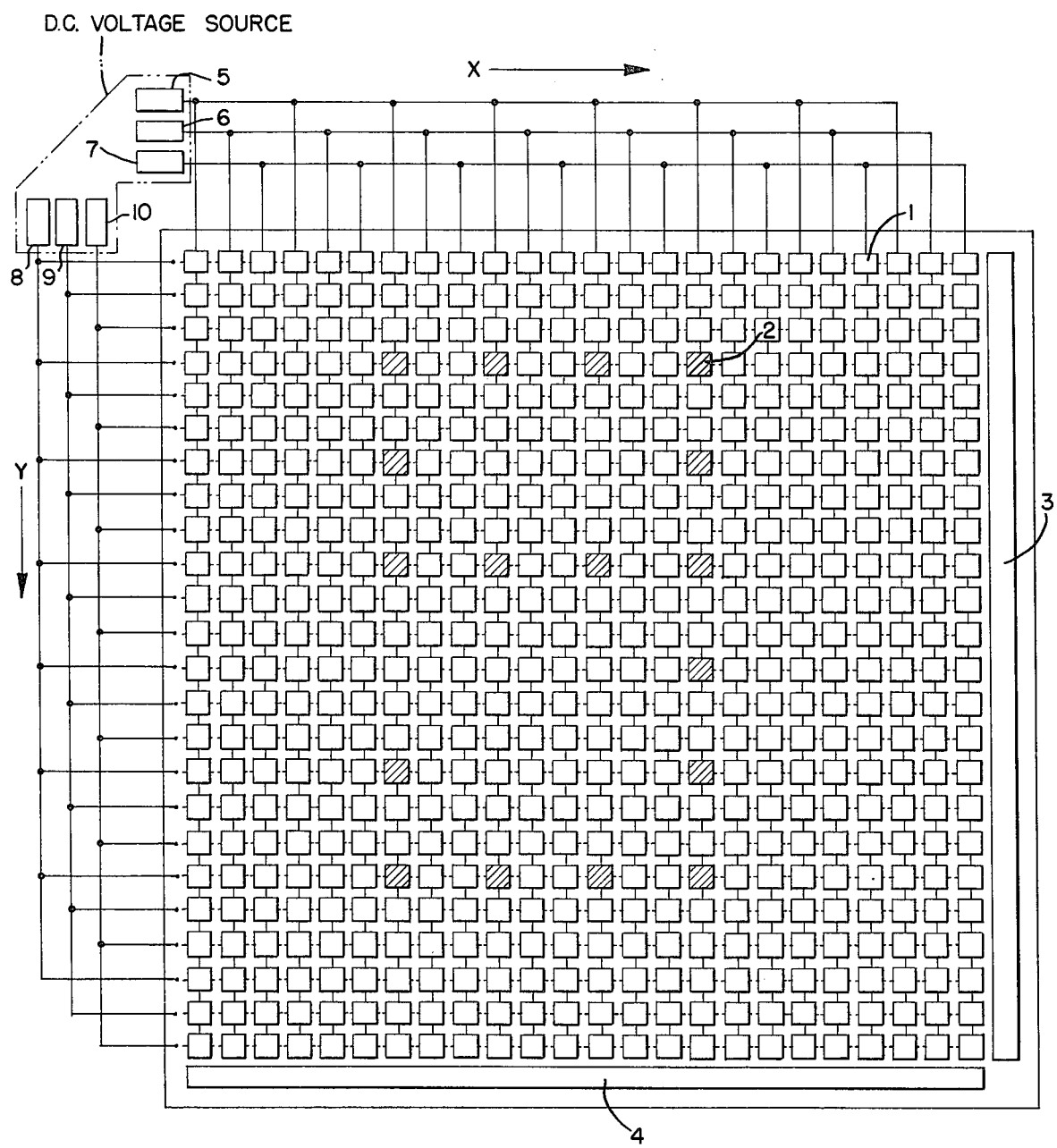
FIG. 1 is a plan view for explaining a concept of an X-Y dual directional shift array of the present invention.

Recently, there has been developed a shift register of a novel structure having a semiconductor body, a thin insulating layer disposed on one surface of the semiconductor body, and a plurality of electrodes disposed on the insulating layer, and described in *Charge Coupled Semiconductor Devices*, By W.S. Boyle and G.E. Smith, The Bell System Technical Journal, Volume 49, No. 4 (April, 1970), Pages 587-593.

Conventional charge coupled semiconductor devices have the MIS (Metal-Insulator-Semiconductor) structure which is well known in the art. Typically, such a device comprises a semiconductor body, an insulating layer disposed on one surface of the semiconductor body, means for introducing electric charge carries into the semiconductor body, electrodes separately disposed on the insulating layer for storing the electric charge carriers introduced into the semiconductor body and for transferring the electric charge carries along the surface of the semiconductor body adjacent to the insulating layer, means connected to the electrodes for applying an electric field for transferring the carriers to the semiconductor body, and means for detecting the carriers thus transferred.

As the electric charge carries, minority carriers in the semiconductor body are utilized since a semiconductor is suitable for generating minority carriers. That is, when the semiconductor body is of n-type holes are utilized as electrical charge carriers, and when the semiconductor body is a p-type, electrons are utilized.

The charge coupled semiconductor device functions in the following manner.

A DC voltage is applied to one of the electrodes on the insulating layer, so that a depletion region is produced in the surface portion of the semiconductor body adjacent to the insulating layer corresponding to the electrode. Since this depletion region is produced only in the surface portion of the semiconductor body immediately below the electrode applied with the DC voltage, a potential well is formed at that portion.

In this state, minority carriers are introduced into the semiconductor body by means of, for example, the application of a forward voltage to a p-n junction in the device, an inducement of an avalanche phenomenon in a Metal-Oxide-Semiconductor structure, or an irradiation of radiant rays or light. These minority carriers are then collected in the potential well.

A DC voltage having a larger magnitude than the voltage already applied to the first electrode is applied to another electrode next to the first electrode, with the consequence that a deeper potential well if formed thereunder.

Since carriers in the shallow potential well shift to the deep potential well, in minority carriers are transferred to the surface portion in the semiconductor body immediately below the next electrode. After the transit of the minority carriers, the DC voltage applied to the first electrode is cut off and the voltage on the next electrode is reduced to a level equal to the voltage for the first electrode. This stage shows that the minority carriers originally collected immediately below the first electrode are completely transferred to the portion in the semiconductor body immediately below the next electrode.

By repeatedly applying DC voltages in the manner as described above (hereinafter referred to as a well timed relationship) it is possible to transfer the minority carriers from electrode to electrode.

Principles and fundamental structures of charge coupled semiconductor devices are described in detail in the above mentioned paper.

Though the minority carriers are tranferred by applying three phase pulsed DC voltages to trio of electrodes in a well timed relationship in the above mentioned paper, they are also transferred by applying two phase pulsed DC voltages to pair of electrodes in a well timed relationship under changing thickness of the insulating layer under each electrode of pair of electrodes.

In the present invention, as described above, a plurality of charge coupled semiconductor elements are disposed on an insulating layer disposed on one semiconductor body, and electrodes of the charge coupled semiconductor elements are arranged in a matrix, so as to form a row of electrodes toward the X-direction and a column of electrodes toward the Y-direction.

Therefore, when the shift array of the present invention is utilized, it is easy to read out a pattern rotated at an angle of $\theta$ by reading out from the Y-direction the pattern written in from the X-direction. Also, a two-dimensional pattern written in the shift array by light can be read out from the X-direction and from the Y-direction.

A concept of a structure of the X-Y dual directional shift array of the present invention is described hereunder with accompanying FIG. 1 in the case of $\theta$ of 90°.

In FIG. 1, a plurality of electrodes 1,2 are arranged in an (n x m) matrix and, at terminals in the X-direction and the Y-direction, means 3 for detecting carriers transferred toward the X-direction and means 4 for detecting carriers transferred toward the Y-direction are disposed.

There are several electrodes, for example, the electrode 1, under which electrical charge carriers as a signal are not stored, and several electrodes, for example the electrode 2, under which electrical charge carriers as a signal are stored.

The X-Y dual directional shift array becomes an X-directional shift array, when the electrodes of each column are connected to each other, first electrodes, second electrodes and third electrodes of each trio of electrodes of each column are connected to the D.C. voltage sources 5,6,7, respectively, as shown in FIG. 1, and voltages generated by D.C. voltage sources 5,6 and 7 are applied to each trio of the electrodes successively so as to transfer electrical charge carriers toward the X-direction and transferred electrical charge carriers are detected as a signal by the detecting means 3. The array becomes a Y-directional shift array, when electrodes of each column are disconnected, electrodes of each row are connected to each other, first electrodes, second electrodes and third electrodes of each trio of electrodes of each row are connected to the D.C. voltage sources 8,9 and 10, respectively, which is effected in FIG. 1, by cutting the solid lines between the electrodes and connecting terminals disposed on each electrode to each and voltages generated by D.C. voltage sources 8,9 and 10 are applied to each trio of the electrodes successively, so as to transfer electrical charge carriers toward the Y-direction and transferred electrical charge carriers are detected as a signal by the detecting means 4.

As means (not shown) for generating electrical carriers, a p-n junction, Schottky junction, light excitation and avalanche phenomenon can be utilized.

When light (not shown) having the pattern "9", irradiates the X-Y dual directional shift array and electrical charge carries are injected only into the part irradiated by the light, an information signal 9 in FIG. 1 is obtained. When a p-n junction is utilized, electrical charge carriers are introduced into the semiconductor body from the opposite end to the detecting means 3 and 4.

In the charge coupled semiconductor device, the distance beween electrodes adjacent each other should be small for transferring electrical charge carriers efficiently, since no means for forming depletion region exists between electrodes. Actually, the depletion region is spread along the surface of the semiconductor body between the electrodes by means of an end effect of the voltage applied to the electrodes. The spread of the depletion region along the surface of the semiconductor body has the same length as the length of the depletion region perpendicular to the surface formed by the voltage. For example, when then-type semiconductor body, having a resistivity of about 10 $\Omega$-cm, is utilized, the length of the depletion region perpendicular to the surface of the semiconductor body is about 1.4$\mu$ under equilibrium conditions, and the spread of the depletion region toward the surface of the semiconductor body is about 1.4$\mu$ from the end of the electrode. Therefore, to form the depletion region in the surface of the semiconductor body between the electrodes, the distance between the electrodes should be within about 2.8$\mu$, that is, twice the spread of the depletion region. Namely, when the distance between the electrodes is more than twice the length of the depletion region, it is hard to form the depletion region under the portion between the electrodes and, therefore, it becomes difficult to transfer the carriers through the surface of the semiconductor body between the electrodes. Therefore, the distance between the electrodes should be small such as within about 3$\mu$.

In the present invention, the distances between adjacent electrodes toward the X-direction and also the Y-direction should be arranged within such distance, or another electrode should be disposed between adjacent electrodes for making the distance small.

Concrete embodiments of the present invention are shown in FIGS. 2a-2b and 3a-3b.

Figure 2A:
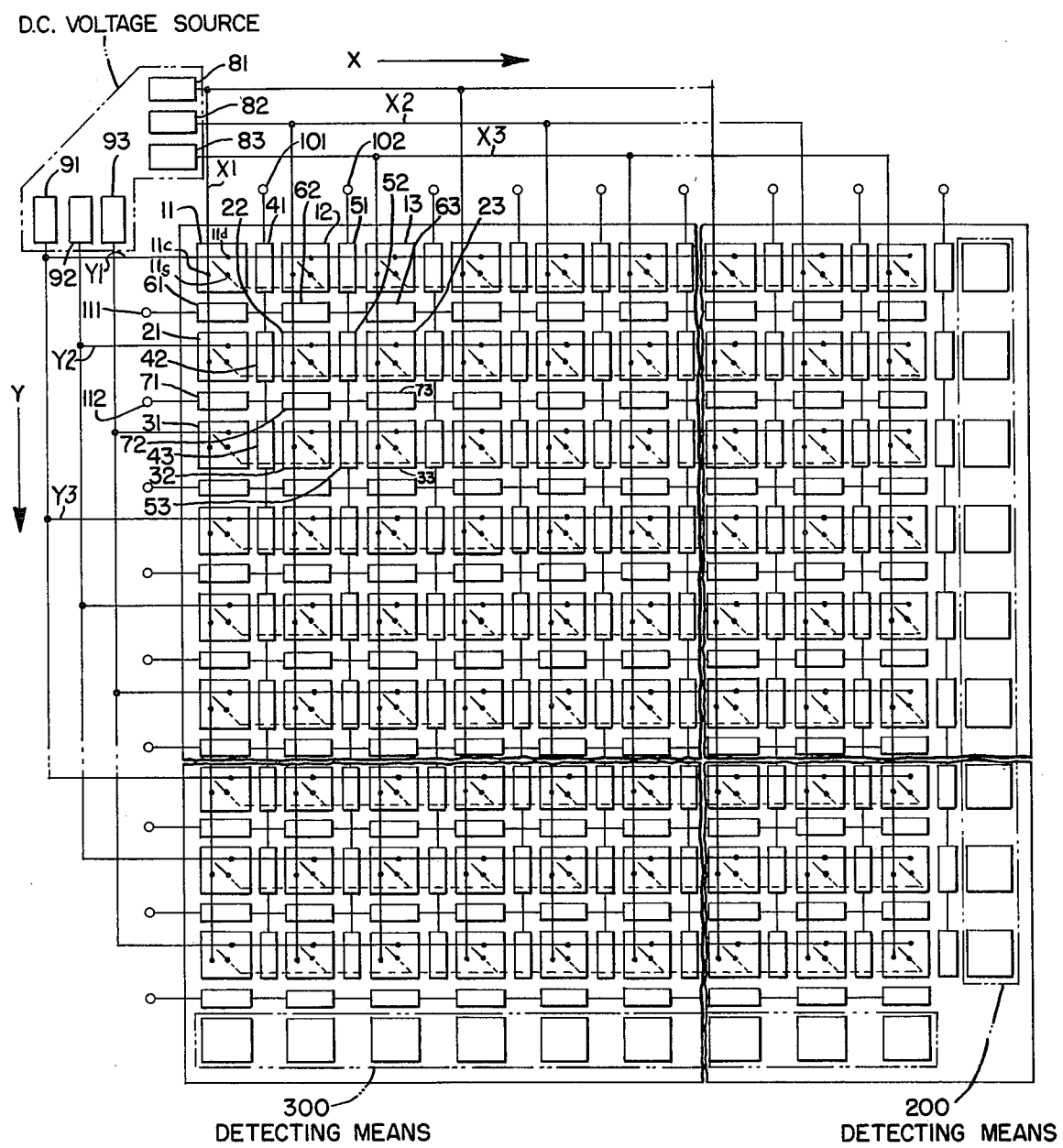
FIG. 2a and 2b are plan views of one embodiment of the present invention.
Figure 2B:
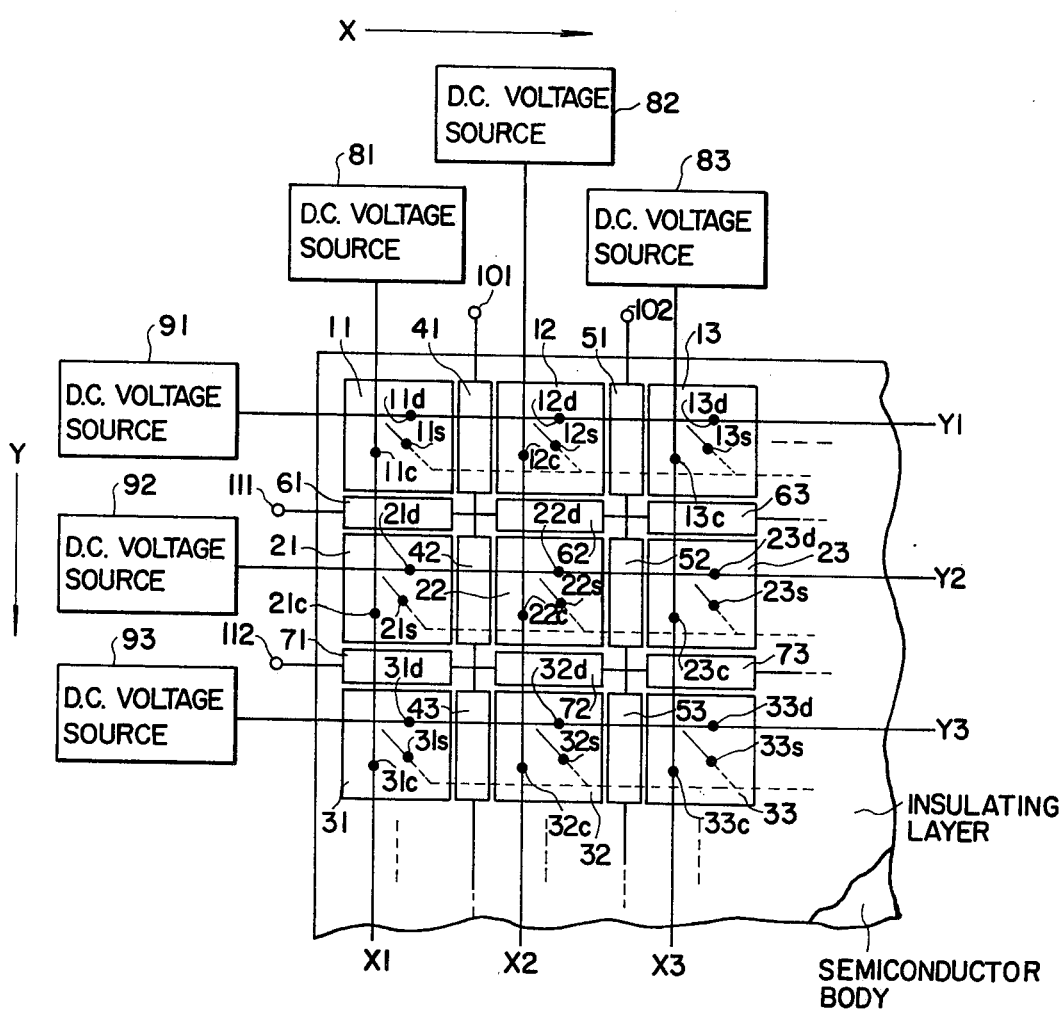

FIG. 2a shows a construction of one concrete embodiment of the present invention and, in FIG. 2b, a fundamental portion of the construction depicted in FIG. 2a is shown.

In FIGS. 2a and 2b, numerals 11-13, 21-23 and 31-33 are electrodes for transferring the carriers, numerals 41-43 and 51-53 are electrodes for preventing the transit of carriers toward the X-direction, numerals 61-63 and 71-73 are electrodes for preventing the transit of carriers toward the Y-direction, numerals 81-83 are means for applying DC voltages to the electrodes 11-13, 21-23 and 31-33 in a well timed relationship for transferring carriers toward X-direction, numerals 91-93 are means for applying DC voltages to electrodes 11,21, 31,12,22,32, 13,23, and 33 in a well timed relationship for transferring carriers toward the Y-direction, numerals 101 and 102 are means for applying DC voltages to electrodes 41-43 and 51-53 for preventing the transit of carriers toward the X-direction, numerals 111 and 112 are means for applying DC voltage to electrodes 61-63 and 71-73 for preventing the transit of carriers toward Y-direction, numerals 11c–13c, 11d–13d, 21c–23c, 31c–33c, and 31d–33d are contact points not contacting the electrodes 11-13, 21-23 and 31-33, and numerals 11s–13s, 21s–23s and 31s–33s are switching means whose one end contacts the electrodes 11-13, 21-23 and 31-33 respectively, and the other ends which contact the contact points 11c–13c, 11d–13d, 21c–23c, 21d–23d, 31c–33c and 31d–33d, respectively.

Figure 3A:
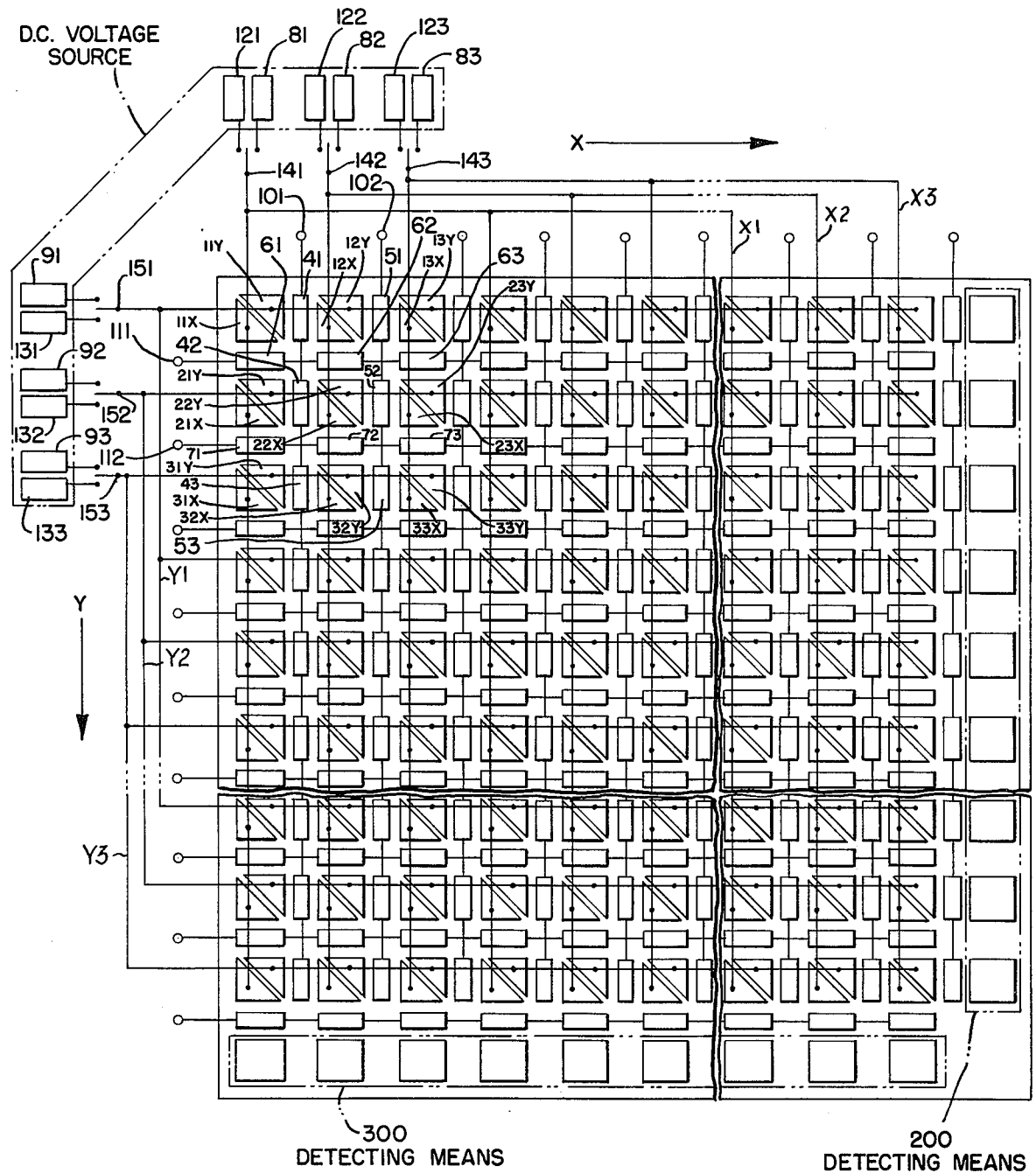
FIG. 3a and 3b are plan views of another embodiment of the present invention.
Figure 3B:
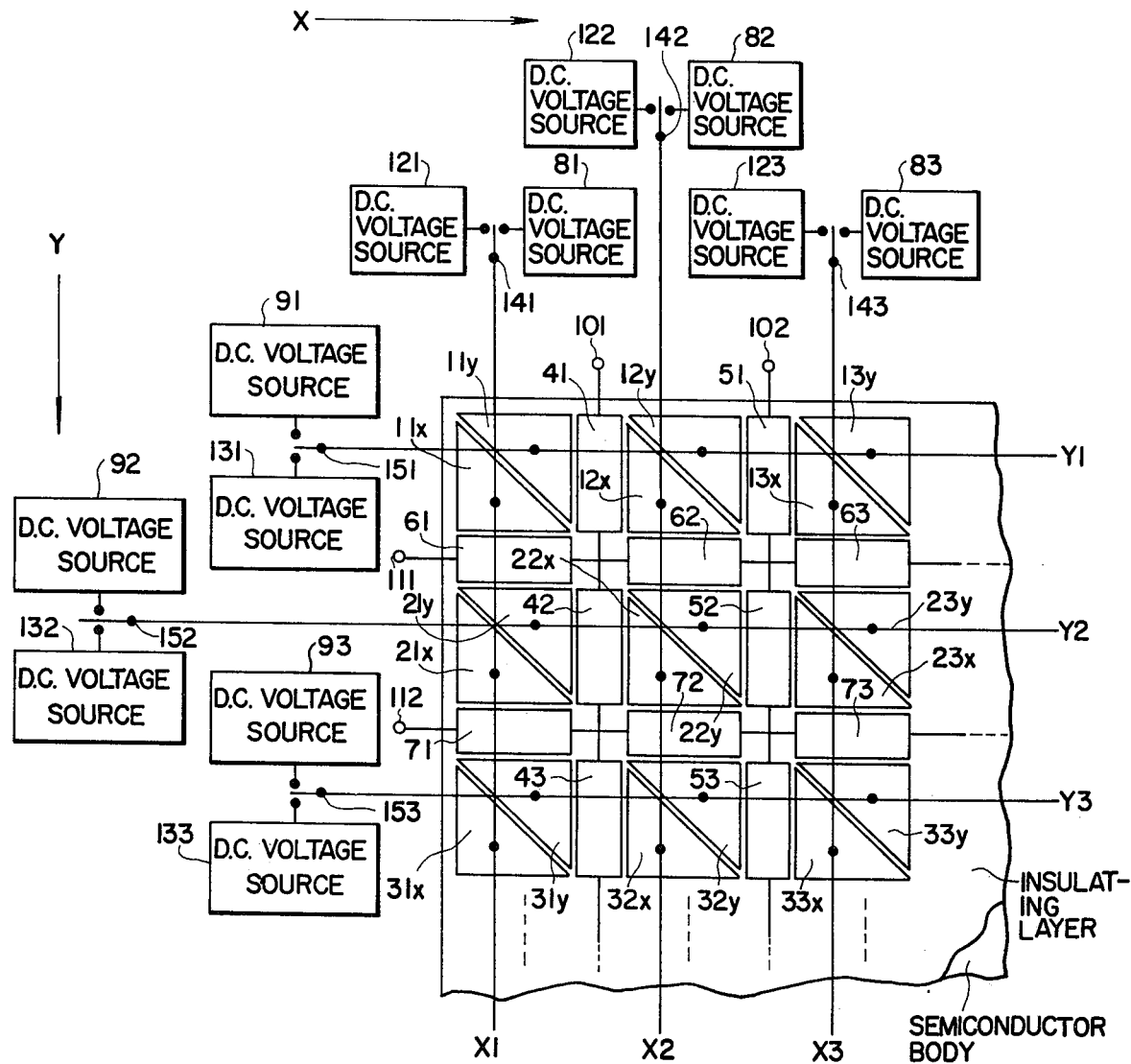

In FIG. 3b, for purposes of clarity, the switching means and contact points for only electrode 11 have been specifically depicted.

When the carriers are to be transferred toward the X-direction, the electrodes 11,21,31,12,22,32,13,23,33 are connected to conductors X1,X2,X3 through the switching means 11s,21s, 31s12s,22s,32s, 13s,23s,33s and contact points 11c,21c,31c,12c,22c,32c,13c,23c,33c. Pulsed DC voltages are applied to the electrodes 11,21,31,12,22,32,13, 23,33 in a well timed relationship by DC voltage applying means 81,82, 83 and pulsed DC voltages of the same polarity as the pulsed DC voltages applied to the electrodes 11-13, 21-23, and 31-33 are applied to the electrodes 41-43, 51-53 in a well timed relationship with the pulsed DC voltages applied to the electrodes 11-13, 21-23, 31-33 by DC voltages applying means 101 and 102. Also DC voltages of a polarity reverse to that of the pulsed DC voltages applied to the electrodes 11-13, 21-23 and 31-33 are applied to the electrodes 61-63, 71-73 by DC voltage applying means 111 and 112 for preventing the transit of carriers toward the Y-direction. The thus transferred carriers are detected by detecting means 200 the same as the detecting means 3 in FIG. 1.

When the carriers are to be transferred toward the Y-direction, the electrodes 11-13, 21-23 and 31-33 are connected to conductors Y1,Y2 and Y3 through the switching means 11s-13s, 21s-23s and 31s-33s and contact points 11d-13d, 21d-23d and 31d-33d and pulsed DC voltages are applied to electrodes 11-13, 21-23 and 31-33 in a well timed relationship by DC voltage applying means 91,92 and 93. Pulsed DC voltages of the same polarity as the pulsed DC voltages applied to the electrodes 11-13, 21-23 and 31-33 are applied to the electrodes 61-63, 71-73 in a well timed relationship with the pulsed DC voltages applied to the electrodes 11-13, 21-23 and 31-33 by DC voltage applying means 111 and 112 and, also DC voltages of a polarity reverse to that of the pulsed DC voltages applied to the electrodes 11-13, 21-23 and 31-33 are applied to the electrodes 41-43 and 51-53 by DC voltage applying means 101 and 102 for preventing the transit of carriers toward the X-direction. The thus transferred carriers are detected by detecting means 300 the same as the detecting means 4 in FIG. 1.

In the embodiment under consideration, an n-type Si substrate having a specific resistance of about 10Ω-cm and an insulating film of $SiO_2$ about 1000 A in thickness was used. To transfer the carriers, a pulsed DC voltage of about −25V was applied to the electrodes 11-13, 21-23 and 31-33 in a well timed relationship by DC voltage applying means 81-83 and 91-93. Further, a pulsed DC voltage of about −25V was applied to the electrodes 41-43 and 51-53 in a well timed relationship by DC voltage applying means 101 and 102 and a DC voltage of about +10V was applied to the electrodes 61-63 and 71-73 by DC voltage applying means 111 and 112 for transferring the carriers toward the X-direction. Furthermore, a pulsed DC voltage of about −25V was applied to the electrodes 61-63 and 71-73 in a well timed relationship by DC voltage applying means 111 and 112, and a DC voltage of about +10V was applied to the electrodes 41-43 and 51-53 by DC voltage applying means 101 and 102 for transferring the carriers toward the Y-direction.

This embodiment, however, has a complexity such that the switching means 11s-13s, 21s-23s and 31s-33s must be operated for changing the transit direction.

Another embodiment of the present invention which does not have such complexity is shown in FIG. 3a and 3b.

FIG. 3a shows a construction of another embodiment of the present invention and, in FIG. 3b, a fundamental portion of the construction shown in FIG. 3a is depicted.

In FIGS. 3a and 3b, the same parts as the embodiment shown in FIGS. 2a and 2b are denoted by same numerals.

In this embodiment, the electrode in FIGS. 2a and 2b is divided into two parts, one of which is for transferring carriers toward the X-direction, and the other of which is for transferring carriers toward the Y-direction, that is, electrodes 11,12, 13,21,22,23, 31,32 and 33 in FIG. 2 are divided to 11x, 12x, 13x, 21x, 22x, 23x, 31x, 32x and 33x for transferring carriers toward the X-direction and to 11y, 12y, 13y, 21y, 22y, 23y, 31y, 32y and 33y for transferring carriers toward the Y-direction.

When the carriers are to be transferred toward the X-direction conductors X1,X2 and X3 are connected to means 81,82 and 83 for applying DC voltages to the electrodes 11x,21x,31x,12x,22x,32x,13x23x and 33x through switching means 141,142, and 143, pulsed DC voltages are applied to the electrodes 11x, 21x, 31x, 12x, 22x, 32x, 13x, 23x. and 33x in a well timed relationship by DC voltage applying means 81,82, and 83 pulsed DC voltages of the same polarity as the pulsed DC voltages applied to the electrodes 11x, 21x, 31x, 12x, 22x. 32x, 13x, 23x and 33x are applied to the electrodes 41-43, 51-53 in a well timed relationship with the pulsed DC voltages applied to the electrodes 11x-13x, 21x-23x, 31x-33x by DC voltage applying means 101 and 102, DC voltages of a polarity reverse to that of the pulsed DC voltages applied to the electrodes 11x-13x, 21x-23x and 31x-33x are applied to the electrodes 61-53 and 71-73 by DC voltage applying means 111 and 112 for preventing the transit of carriers toward the Y-direction, and DC voltages of the same polarity as the pulsed DC voltages applied to the electrodes 11x-13x, 21x-23x and 31x-33x are applied to the electrodes 11y-13y, 21y-23y, and 31y-33y by DC voltage applying means 131, 132 and 133 through the switching means 151, 152, and 153. The then transferred carriers are detected by detecting means 200, the same as the detecting means 3 in FIG. 1.

When the carriers to be transferred toward the Y-direction, conductors Y1, Y2 and Y3 are connected to means 91, 92 and 93 for applying DC voltages to the electrodes 11y-13y, 21y-23y and 31y-33y through the switching means 151, 152 and 153, pulsed DC voltages are applied to the electrodes 11y-13y, 21y-23y and 31y--33y in a well timed relationship by DC voltage applying means 91, 92, and 93, pulsed DC voltages of the same polarity as the pulsed DC voltages applied to the electrodes 11y-13y, 21y-23y and 31y-33y are applied to the electrodes 61-63 and 71-73 in a well timed relationship with the pulsed DC voltages applied to the electrodes 11y-13y, 21y-23y, and 31y-33y by DC voltage applying means 111 and 112, DC voltages of a polarity reverse to that of the pulsed DC voltages applied to the electrodes 11y-13y, 21y-23y and 31y-33y are applied to the electrodes 41-43 and 51-53 by DC voltage applying means 101 and 102 for preventing the transit of carriers toward the X-direction and DC voltages of the same polarity as the pulsed DC voltages applied to the electrodes 11y-13y, 21y-23y and 31y-33y are applied to the electrodes 11x, 21x, 31x, 12x, 22x, 23x, 31x, 32x, 33x by DC voltage applying means 121, 122 and 123 through the switching means 141, 142 and 143. The thus transferred carriers are detected by detecting means 300 the same as the detecting means 4 in FIG. 1.

In the embodiment under consideration, an n-type Si susbstrate having a specific resistance of about 10Ω-cm and an insulating film of $SiO_2$ about 1000 A in thickness was used. To transfer the carriers, a pulsed DC voltage of about −25V was applied to the electrodes 11x-13x, 21x-23x and 31x-33x; and 11y-13y, 21y-23y and 31y--33y in a well timed relationship by DC voltage applying means 81-83 and 91-93. Further, a pulsed DC voltage of about −25V was applied to the electrodes 41-43 and 51-53 in a well timed relationship by DC voltage applying means 101 and 102, a DC voltage of about +10V was applied to the electrodes 61-63 and 71-73 by DC voltage applying means 111 and 112, and a DC voltage of about −25V was applied to the electrodes 11y–13y, 21y–23y and 31y–33y by DC voltage applying means 131, 132 and 133, for transferring the carriers toward the X-direction. Furthermore, a pulsed DC voltage of about −25V was applied to the electrodes 61–63 and 71–73 in a well timed relationship by DC voltage applying means 111 and 112, a DC voltage of about +10V was applied to the electrodes 41–43 and 51–53 by DC voltage applying means 101 and 102, and a DC voltage of about −25V was applied to the electrodes 11x, 21x, 31x, 12x, 22x, 32x, 13x, 23x, 33x by DC voltage applying means 131, 132, and 133, for transferring the carriers toward the Y-direction.

In the embodiment in FIGS. 3a and 3b, the electrode for transferring the carriers in FIGS. 2a and 2b is divided to two parts. Though the configuration of the part of the electrode is triangle in FIGS. 3a and 3b, it is not limited to such a configuration. Any configuration such as a rectangular shape can be utilized. Further, it is not necessary that the sizes of the parts of the electrode be the same. When a signal output detected from one direction is intense, the sizes of the electrodes toward the one direction should be large. Furthermore, even if the sizes of the electrodes are different, signal intensities toward both directions can become the same by amplifying the output signal.

As described above, according to the present invention, a rotation of axes of co-ordinates of a pattern distributed two-dimensionally at an angle 90° is easily accomplished.

In the present invention, techniques utilized in conventional charge coupled semiconductor devices, such as means for generating the carriers, means and techniques for transferring carriers, and means for detecting transferred carriers can be utilized. Particularly useful means and methods are disclosed in U.S. Pat. application Ser. No. 11,541 assigned to Bell Telephone Laboratories, Inc.

While the invention has been explained in detail, it is to be understood that the technical scope of the invention is not limited to that of the foregoing embodiments but applicable to all shift arrays as stated in the claims.

We claim:

1. A shift array for shifting carriers introduced into a semiconductor body along first and second respective directions, comprising:
   a semiconductor body;
   an insulating film disposed on the semiconductor body;
   a matrix of sets of electrodes disposed on said insulating layer made of n rows of sets of electrodes disposed in said first direction and m columns of sets of electrodes disposed in said second direction, each second of electrodes comprising a pair of electrode portions located next to one another;
   $n$ conductors respectively connected to a first electrode portion of each electrode set in a corresponding row of said $n$ rows of sets of electrodes;
   $m$ conductors respectively connected to a second electrode portion of each electrode set in a corresponding column of said $m$ columns of sets of electrodes;
   first means, disposed adjacent the last ones of said sets of electrodes, for detecting transferred minority carriers; and
   second means for selectively applying D.C. voltages to the conductors of said rows and columns for effecting the transfer of minority carriers along the surface of the semiconductor body therebeneath toward said first means.

2. A shift array according to claim 1, further including first and second pluralities of additional electrodes, respectively disposed on said insulating film between the adjacent first and second electrode portions of the sets of electrodes of said matrix and between the last ones of the electrodes and the detecting means, and third means, coupled to said additional electrodes, for selectively applying D.C. voltages to said additional electrodes, for selectively preventing the transit of carriers towards a prescribed direction.

3. A shift array according to claim 2, wherein said semiconductor body is an n-type Si substrate having a specific resistance of about 10 Ωcm, said insulating film is a film of $SiO_2$ about 1000 A in thickness, and the distance between the electrode of said matrix and said additional electrode adjacent thereto is within about three microns.

4. A shift array for shifting carriers, introduced into a semiconductor body, along first and second respective directions, comprising:
   a semiconductor body;
   an insulating layer disposed on said semiconductor body;
   a matrix of sets of first electrodes disposed on said insulating layer made up of $n$ rows of m sets first electrodes disposed in said first direction and m columns of $n$ sets of first electrodes disposed in said second direction, so as to form an $n \times m$ matrix of sets of first electrodes extending in said first and second directions, each set of first electrodes comprising a pair of first electrodes disposed adjacent to one another;
   $n$ rows of $m$ second electrodes, disposed in said first direction, respectively adjacent each row of $m$ sets of first electrodes, and m columns of n second electrodes, disposed in said second direction, respectively adjacent each column of $n$ sets of first electrodes, so that between each adjacent set of first electrodes of said matrix there is disposed a second electrode, the $n^{th}$ row of sets of first electrodes is disposed between the $(n-1)^{th}$ and the $n^{th}$ row of the second electrodes, and the $m^{th}$ column of sets of first electrodes is disposed between the $(m-1)^{th}$ column and the $m^{th}$ column of second electrodes;
   $n$ conductors respectively connected to one of the first electrodes of each set of first electrodes in a corresponding row of the $n$ rows of sets of first electrodes;
   $m$ conductors respectively connected to the other of the first electrodes of each set of first electrodes in a corresponding column of the $m$ columns of sets of first electrodes;
   first means, disposed adjacent the $m^{th}$ column of second electrodes, for detecting minority carriers transferred in said first direction;
   second means, disposed adjacent the $n^{th}$ row of second electrodes, for detecting minority carriers transferred in said second direction; and
   third means for selectively appylying prescribed D.C. voltages to the conductors of the rows and columns of sets of first electrodes and to the second electrodes of the rows and columns of said second electrodes, for effecting the transfer of minority carriers in the surface of the semiconductor body therebeneath toward said first and second means.

5. A shift array according to claim 4, wherein said third means comprises first voltage source means, switchably connected to said $m$ conductors, for selectively applying pulsed D.C. voltages of a first polarity to the other first electrode of the $m$ columns of sets of first electrodes in a prescribed timed relationship, means for applying a pulsed D.C. voltage of first polarity to the $m$ columns of second electrodes while applying a D.C. voltage of a second polarity, opposite said first polarity, to the $n$ rows of second electrodes, and second voltage source means, switchably connected to said $n$ conductors, for selectively applying a D.C. voltage of said first polarity to the one first electrode of the $n$ rows of sets of first electrodes, to thereby effect the transfer of minority carriers in said first direction.

6. A shift array according to claim 5, wherein said third means further comprises third voltage source means, switchably connected to said $n$ conductors, for selectively applying pulsed D.C. voltages of said first polarity to the one first electrode of the $n$ rows of sets of first electrodes in a prescribed timed relationship, means for applying a pulsed D.C. voltage of said first polarity to the $n$ rows of second electrodes, while applying a D.C. voltage of said second polarity to the $m$ columns of second electrodes, and fourth voltage source means, switchably connected to said $m$ conductors, for selectively applying a D.C. voltage of said first polarity to the other first electrode of the $m$ columns of sets of first electrodes, to thereby effect the transfer of minority carriers in said second direction.

7. A shift array according to claim 6, wherein the distance between a second electrode and the adjacent electrode of an adjacent set of first electrodes is within about three microns.

8. A shift array for shifting carriers introduced into a semiconductor body along first and second directions oriented at an angle with respect to each other, said first and second directions being represented by an X-direction and a Y-direction, respectively, which comprises:
 a semiconductor body;
 an insulating layer disposed on the semiconductor body;
 first electrodes disposed on the insulating layer and arranged in a matrix on the X–Y plane, whereby said electrodes comprise rows of electrodes toward the X-direction and columns of electrodes toward the Y-direction;
 conductors connected to the electrodes of each row for carriers transferred toward the Y-direction;
 conductors connected to the electrodes of each column for carriers transferred toward the X-direction;
 means for detecting carriers disposed at portions adjacent the last ones of the electrodes in the X-direction and the Y-direction to detect transferred carriers;
 means for appling D.C. voltages to the electrodes connected to the conductors to transfer introduced carriers toward one of said detecting means; and
 wherein each first electrode is divided into two parts, one of which is for transferring carriers toward the X-direction, the other of which is for transferring carriers toward the Y-direction, conductors connected to the electrodes of one part of each row, conductors connected to the electrodes of the other part of each column, and which further comprises electrodes disposed between adjacent electrodes, means for appying a D.C. voltage connected to the electrodes, and means for applying a D.C. voltage to be connected to one of the conductors.

* * * * *